United States Patent
Takezawa et al.

(10) Patent No.: US 12,252,786 B2
(45) Date of Patent: Mar. 18, 2025

(54) CLEANING METHOD AND SUBSTRATE PROCESSING APPARATUS

(71) Applicant: Tokyo Electron Limited, Tokyo (JP)

(72) Inventors: Yoshihiro Takezawa, Nirasaki (JP); Daisuke Suzuki, Nirasaki (JP); Hiroyuki Hayashi, Nirasaki (JP); Tatsuya Miyahara, Nirasaki (JP); Keisuke Fujita, Nirasaki (JP); Masami Oikawa, Oshu (JP); Sena Fujita, Nirasaki (JP)

(73) Assignee: Tokyo Electron Limited, Tokyo (JP)

( * ) Notice: Subject to any disclaimer, the term of this patent is extended or adjusted under 35 U.S.C. 154(b) by 419 days.

(21) Appl. No.: 17/753,004

(22) PCT Filed: Aug. 6, 2020

(86) PCT No.: PCT/JP2020/030214
§ 371 (c)(1),
(2) Date: Feb. 15, 2022

(87) PCT Pub. No.: WO2021/033568
PCT Pub. Date: Feb. 25, 2021

(65) Prior Publication Data
US 2022/0364228 A1  Nov. 17, 2022

(30) Foreign Application Priority Data
Aug. 20, 2019 (JP) .................. 2019-150680

(51) Int. Cl.
*B08B 5/00* (2006.01)
*B08B 9/08* (2006.01)
*B08B 13/00* (2006.01)
*C23C 16/44* (2006.01)
*H01L 21/02* (2006.01)

(52) U.S. Cl.
CPC ............ *C23C 16/4405* (2013.01); *B08B 5/00* (2013.01); *B08B 9/08* (2013.01); *B08B 13/00* (2013.01); *H01L 21/02057* (2013.01); *B08B 2209/08* (2013.01); *H01L 21/02532* (2013.01)

(58) Field of Classification Search
CPC ......... C23C 16/4405; B08B 5/00; B08B 9/08; B08B 13/00; B08B 2209/08; H01L 21/02057; H01L 21/02532
USPC ....................................................... 438/507
See application file for complete search history.

(56) References Cited

U.S. PATENT DOCUMENTS 11,260,433 B2 *  3/2022  Takezawa ............... C23C 16/24

FOREIGN PATENT DOCUMENTS

| JP | 2007-141895 A | 6/2007 |
| JP | 2007-150213 A | 6/2007 |
| JP | 2009-076590 A | 4/2009 |
| JP | 2019-091763 A | 6/2019 |

* cited by examiner

*Primary Examiner* — Monica D Harrison
(74) *Attorney, Agent, or Firm* — Armstrong Teasdale LLP

(57) ABSTRACT

A cleaning method according to an aspect of the present disclosure includes: supplying a halogen-containing gas that does not contain fluorine to an interior of a processing container that is capable of being exhausted via an exhaust pipe to perform a cleaning; and supplying a fluorine-containing gas to at least one of the interior of the processing container and an interior of the exhaust pipe to perform the cleaning after the supplying the halogen-containing gas to perform the cleaning.

12 Claims, 20 Drawing Sheets

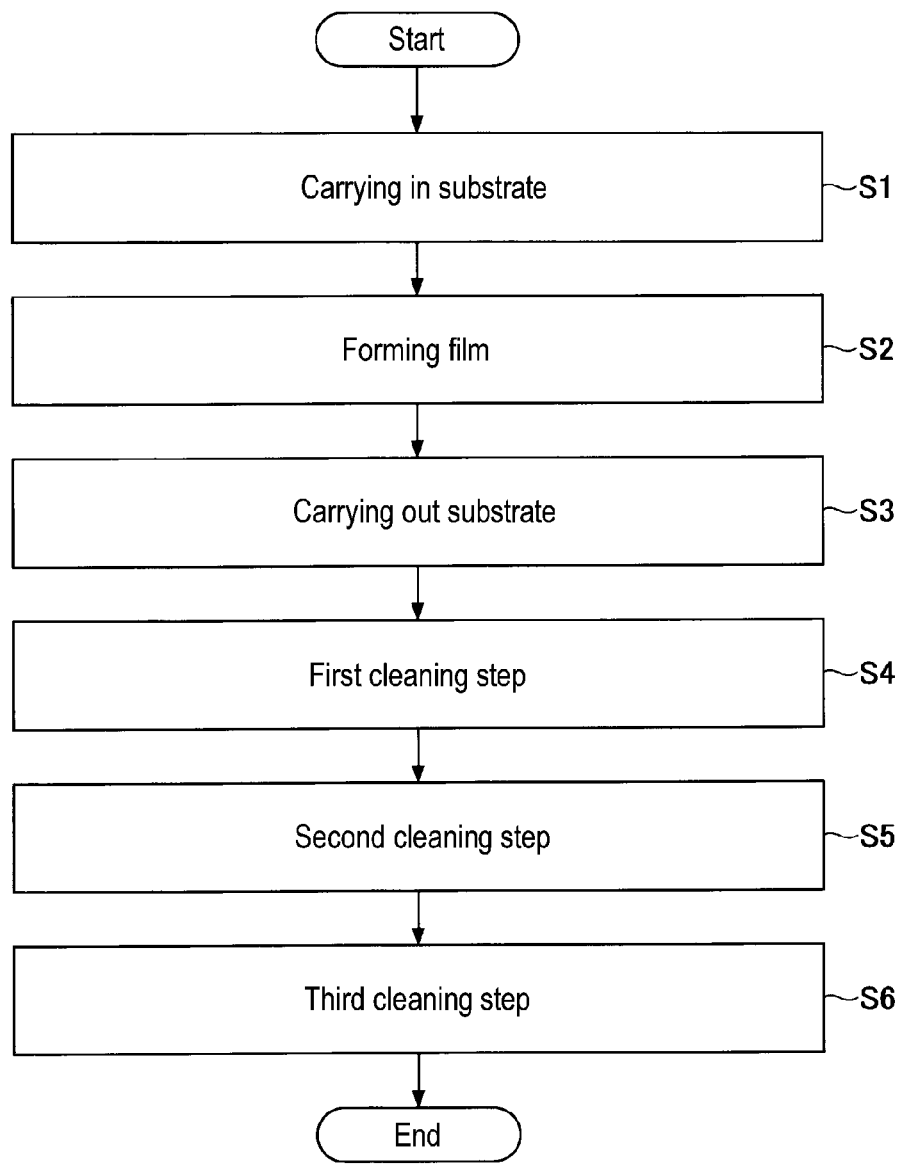

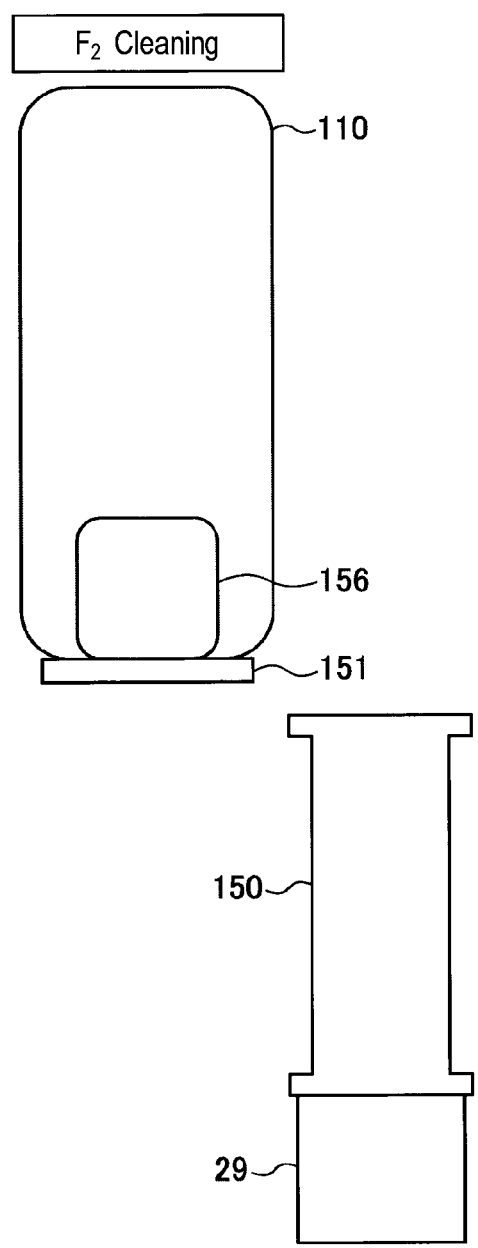

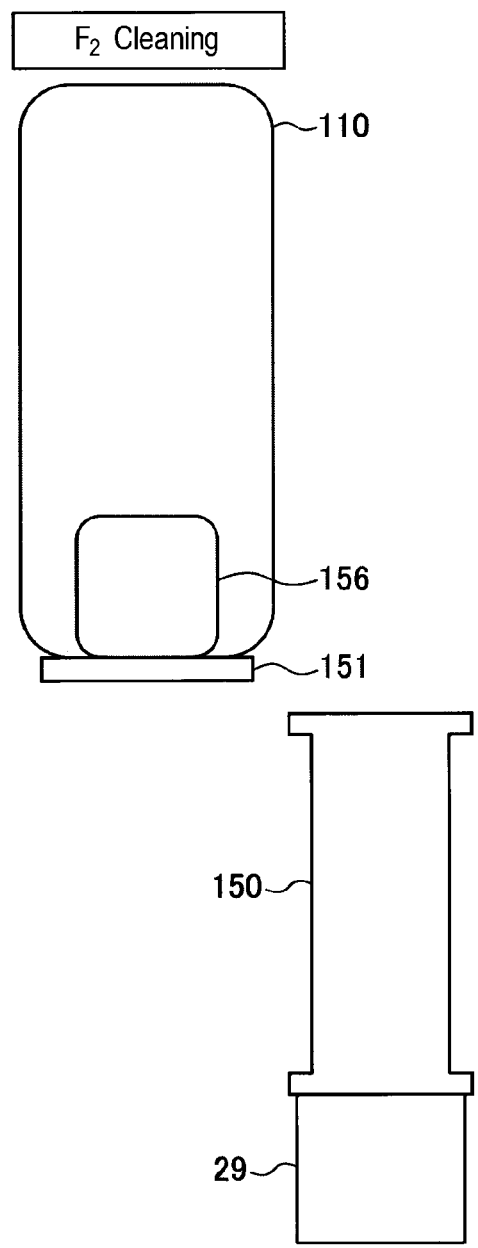

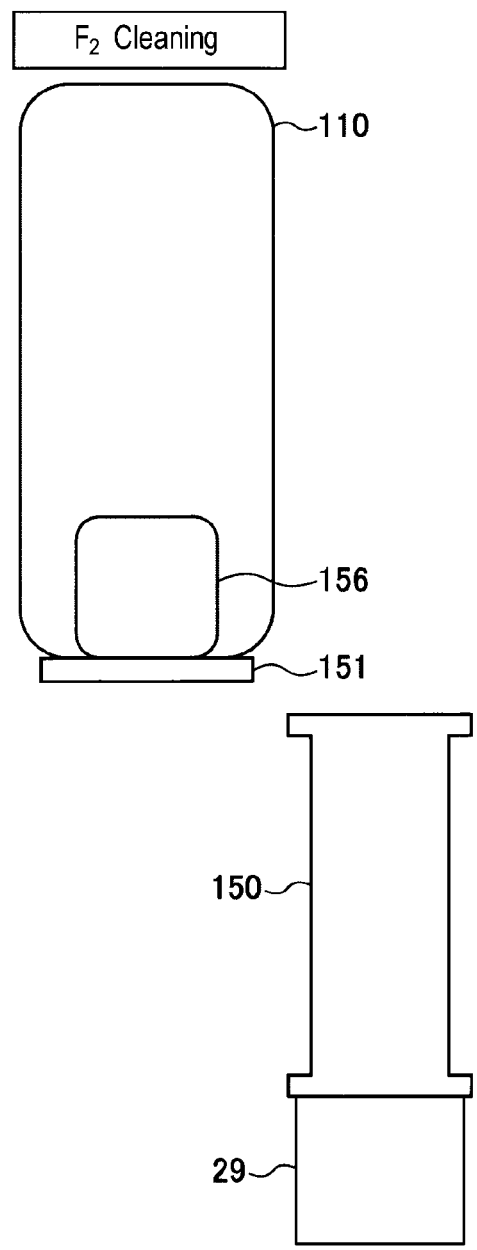

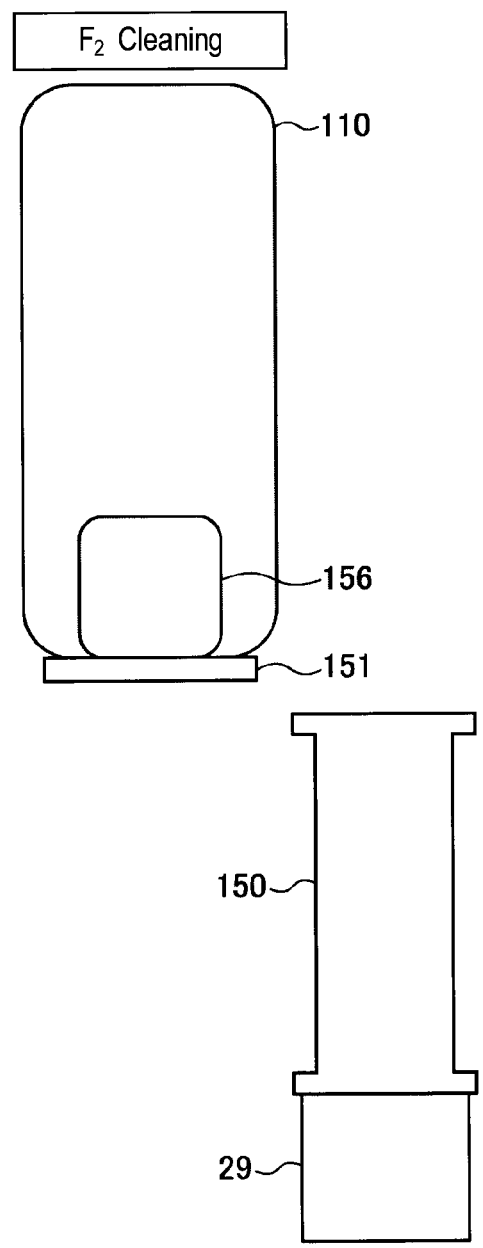

CLEANING METHOD AND SUBSTRATE PROCESSING APPARATUS

CROSS-REFERENCE TO RELATED APPLICATIONS

This application is a U.S. National Stage Application of International Patent Application No. PCT/JP2020/030214, having an International Filing Date of Aug. 6, 2020, which claims the benefit of priority to Japanese Patent Application No. 2019-150680, filed Aug. 20, 2019, each of which is hereby incorporated by reference herein.

TECHNICAL FIELD

The present disclosure relates to a cleaning method and a substrate processing apparatus.

BACKGROUND

There is known a technique in which a halogen-containing gas containing no fluorine is supplied to the interior of a processing container to etch away deposits inside the processing container including a wafer boat (see, for example, Patent Document 1).

[Prior Art Documents]
  [Patent Documents]
    Patent Document 1: Japanese Laid-Open Patent Publication No. 2019-091763

SUMMARY

The present disclosure provides a technique capable of dry-cleaning a substrate processing apparatus using a SiC member.

A cleaning method according to an aspect of the present disclosure includes: supplying a halogen-containing gas that does not contain fluorine to an interior of a processing container that is capable of being exhausted via an exhaust pipe to perform a cleaning; and after the supplying the halogen-containing gas to perform the cleaning, supplying a fluorine-containing gas to at least one of the interior of the processing container and an interior of the exhaust pipe to perform the cleaning.

According to the present disclosure, it is possible to dry-clean a substrate processing apparatus using a SiC member.

BRIEF DESCRIPTION OF DRAWINGS

FIG. 4 is a flowchart illustrating the operation of a substrate processing apparatus according to an embodiment.

FIG. 7A is a view illustrating a third example of the cleaning process.

FIG. 8A is a view illustrating a fourth example of the cleaning process.

FIG. 8C is a view illustrating the fourth example of the cleaning process.

FIG. 9A is a view illustrating a fifth example of the cleaning process.

DETAILED DESCRIPTION

Figure 1:
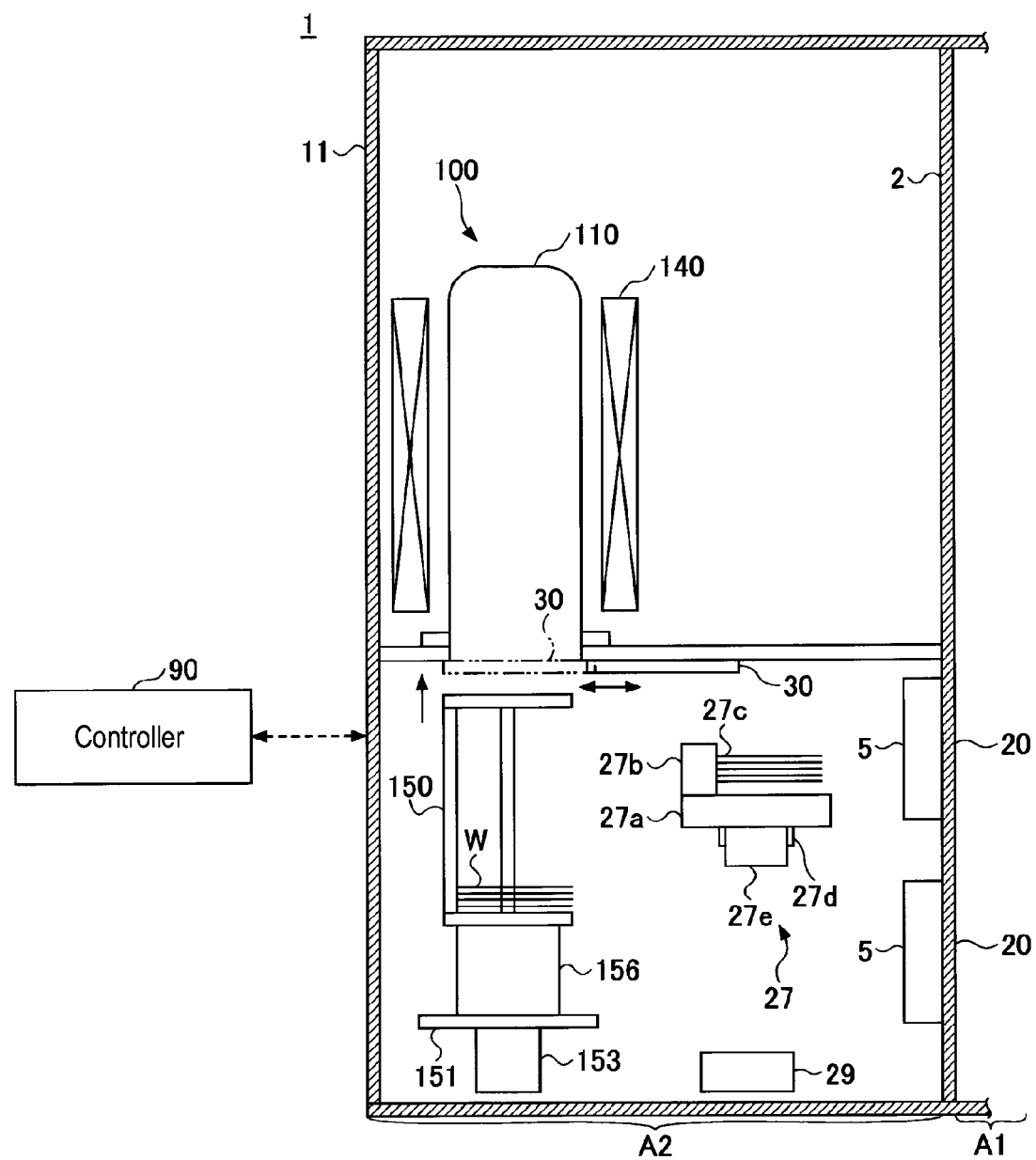
FIG. 1 is a cross-sectional view of a substrate processing apparatus according to an embodiment.

Hereinafter, non-limiting exemplary embodiments of the present disclosure will be described with reference to the accompanying drawings. In all of the accompanying drawings, the same or corresponding members or components will be denoted by the same or corresponding reference numerals, and redundant explanations will be omitted.

[Substrate Processing Apparatus]

Figure 2:
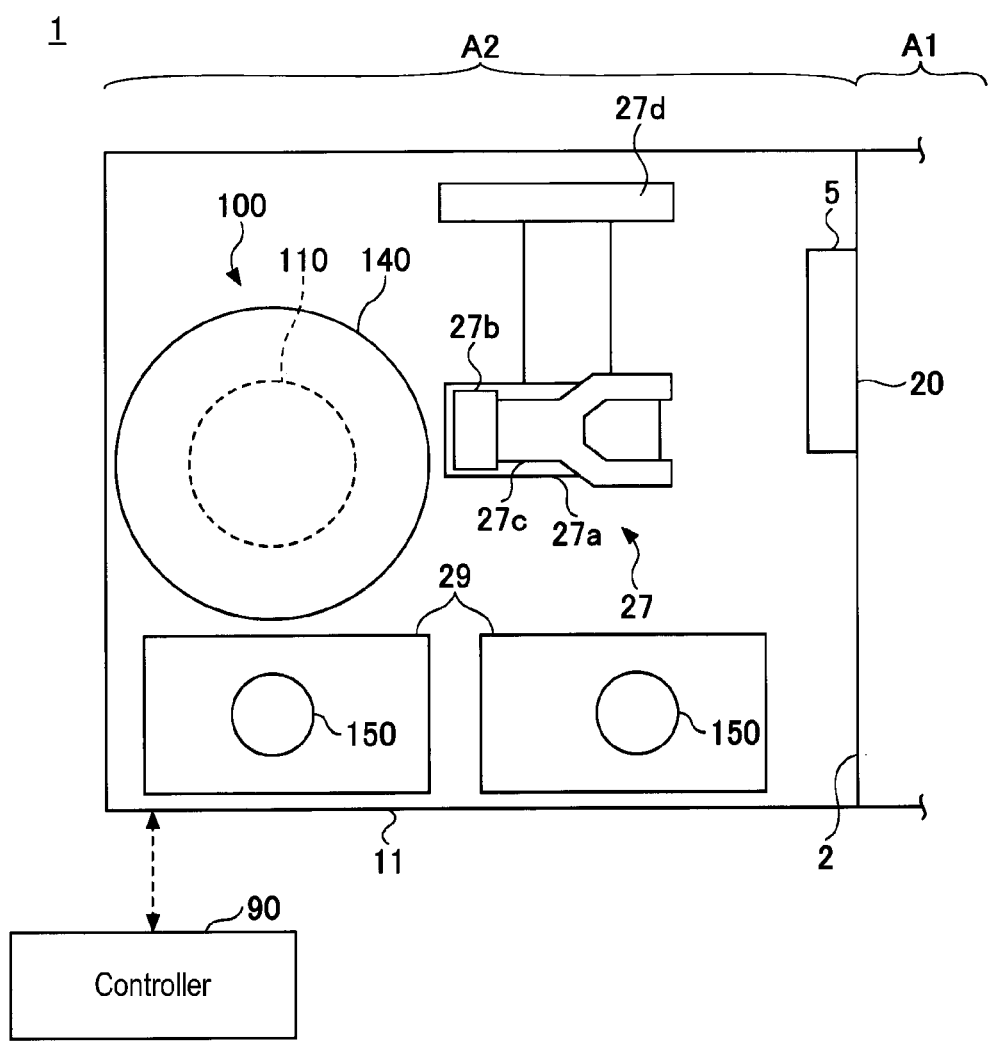
FIG. 2 is a plan view of the substrate processing apparatus of FIG. 1.

FIG. 1 is a cross-sectional view of a substrate processing apparatus according to an embodiment. FIG. 2 is a plan view of the substrate processing apparatus of FIG. 1.

The substrate processing apparatus 1 is a heat treatment apparatus including a vertical processing container. The substrate processing apparatus 1 is accommodated in a housing 11. The housing 11 constitutes the exterior body of the substrate processing apparatus 1. A container transfer region A1 and a substrate transfer region A2 are formed inside the housing 11. The container transfer region A1 is a region in which a carrier (not illustrated), which is a container accommodating a substrate W therein, is carried in and out of the apparatus. The substrate transfer region A2 is a transfer region in which the substrate W inside the carrier is transferred and carried into a heat treatment part 100 to be described later. The carrier is, for example, a front-opening unified pod (FOUP). The substrate W is, for example, a semiconductor wafer.

The container transfer area A1 and the substrate transfer region A2 are separated from each other by a partition wall 2. The container transfer region A1 is a region under an air atmosphere and is a region in which the substrate W accommodated in the carrier is transferred. The region between respective apparatuses corresponds to the container transfer region A1. In an embodiment, a space in a clean room outside the substrate processing apparatus 1 corresponds to the container transfer region A1. The substrate transfer region A2 is in an inert gas atmosphere, for example, a nitrogen (N₂) gas atmosphere in order to prevent formation of a natural oxide film on the substrate W transferred therein. The substrate transfer region A2 is maintained at a low oxygen concentration and a low moisture concentration while having a higher cleanliness than the container transfer region A1. In the following description, an arrangement direction of the container transfer region A1 and the substrate transfer region A2 will be referred to as a front-rear direction of the substrate processing apparatus 1.

The partition wall 2 is provided with a transfer port 20 to allow the container transfer region A1 and the substrate transfer region A2 to communicate with each other so as to transfer the substrate W therethrough. The transfer port 20 is provided with an opening/closing door 5 configured to close the transfer port 20 on the side of the substrate transfer region A2. A drive mechanism (not illustrated) is connected to the opening/closing door 5. The transfer port 20 is opened/closed when the driving mechanism moves the opening/closing door 5 in the front-rear direction and the up-down direction. The transfer port 20 and the opening/closing door 5 are configured according to a front-opening interface mechanical standard (FIMS).

The container transfer region A1 is provided with a load port, a storage shelf, a container placement stage, a transfer device, and the like (none of which are illustrated). The load port is a placement stage that receives the carrier that is to be carried into the substrate processing apparatus 1. The storage shelf is a placement stage for temporarily storing the carrier, and is also called, for example, a buffer or a stocker. The container placement stage is provided to correspond to the transfer port 20. The transfer device transfers the carrier among the load port, the container placement stage, and the storage shelf.

The substrate transfer region A2 is provided with a heat treatment part 100, a wafer transfer mechanism 27, a boat holder 29, and a shutter 30.

The heat treatment part 100 includes a processing container 110 and a heater 140. The processing container 110, which is capable of accommodating the substrate W, is made of quartz and has a cylindrical shape. A lower end of the processing container 110 is open as a furnace opening. The heater 140 is provided around the processing container 110 and has a cylindrical shape. The heater 140 heats the substrate W accommodated in the processing container 110.

Below the heat treatment part 100, a substrate holder 150 is placed on a lid 151 via a heat insulating cylinder 156. The substrate holder 150 holds a plurality of substrates W in a shelf shape. The lid 151 is supported by a lifting mechanism 153, and the substrate holder 150 is carried into or out of the processing container 110 by the lifting mechanism 153.

The wafer transfer mechanism 27 is provided between the substrate holder 150 and the transfer port 20. The wafer transfer mechanism 27 transfers the substrate W between the carrier placed on the container placement stage in the container transfer region A1 and the substrate holder 150 in the substrate transfer region A2. The wafer transfer mechanism 27 includes a guide mechanism 27a, a moving body 27b, a fork 27c, a lifting mechanism 27d, and a rotation mechanism 27e. The guide mechanism 27a has a rectangular parallelepiped shape. The guide mechanism 27a is attached to the lifting mechanism 27d extending in the vertical direction, and is configured to be movable in the vertical direction by the lifting mechanism 27d and to be rotatable by the rotation mechanism 27e. The moving body 27b is provided on the guide mechanism 27a to be movable forward and rearward along the longitudinal direction. The fork 27c is a transfer machine installed via the moving body 27b, and includes a plurality of (e.g., five) forks 27c. By including the plurality of forks 27c, the plurality of substrates W can be transferred at the same time, which makes it possible to shorten the time required for transferring the substrates W. However, a single fork 27c may be provided.

The boat holder 29 holds the substrate holder 150. The boat holder 29 is provided at a position accessible by a transfer device (not illustrated) that transfers the wafer transfer mechanism 27 and the substrate holder 150. The substrate holder 150 is transferred between above the heat insulating cylinder 156 and above the boat holder 29 by the transfer device. Although two boat holders 29 are illustrated in FIG. 2, the number of boat holders 29 may be one or three or more.

The shutter 30 opens and closes an opening at the lower end of the processing container 110. The shutter 30 is moved by a drive mechanism (not illustrated) between a position at which the shutter 30 opens the opening at the lower end of the processing container 110 (a position indicated by the solid line in FIG. 1) and a position at which the shutter 30 closes the opening at the lower end of the processing container 110 (a position indicated by the alternated long and short dash line).

The substrate processing apparatus 1 is provided with a controller 90 configured with, for example, a computer. The controller 90 includes, for example, a data processing part including programs, a memory, and a CPU. The program incorporates commands (respective steps) for allowing the controller 90 to send control signals to each part of the substrate processing apparatus 1 in order to execute each of the processing steps described above. By the control signals, operations, such as the transfer of the carrier, the transfer of the substrate W, the opening/closing of the lid 151, the opening/closing of the opening/closing door 5, and opening/closing of the shutter 30, are controlled so that the transfer and process of the substrate W are performed. The program is stored in a storage medium, such as a computer storage medium such as a flexible disk, a compact disk, a hard disk, a MO (magneto-optical disk), a memory card or the like, and is installed on the controller 90.

Figure 3:
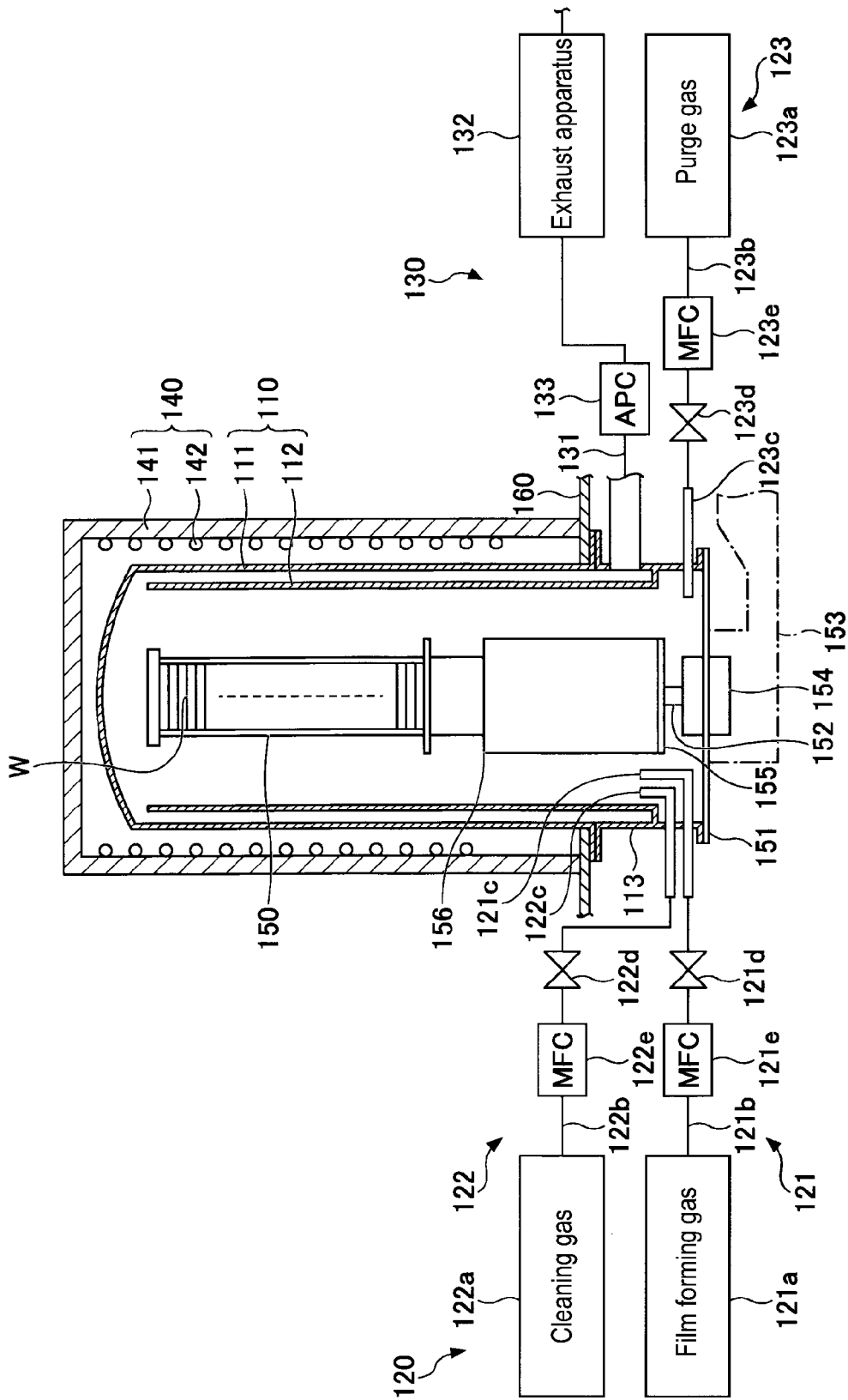
FIG. 3 is a cross-sectional view illustrating an example of a heat treatment part of the substrate processing apparatus of FIG. 1.

FIG. 3 is a cross-sectional view illustrating an example of the heat treatment part 100 of the substrate processing apparatus 1 of FIG. 1. As illustrated in FIG. 3, the heat treatment part 100 includes the processing container 110, a gas supplier 120, an exhauster 130, and a heater 140.

The processing container 110 has a double-tube structure including an outer tube 111 and an inner tube 112. The outer tube 111 has a cylindrical shape with a ceiling. The inner tube 112 has a cylindrical shape and is concentrically arranged inside the outer tube 111.

The outer tube 111 and the inner tube 112 are made of a heat-resistant material such as quartz or silicon carbide (SiC). The outer tube 111 and the inner tube 112 are each held by a cylindrical manifold 113 formed of stainless steel or the like at lower ends thereof. The lid 151 configured to hermetically seal an opening is provided in an opening at the lower end of the manifold 113 to be openable and closable the opening.

A rotary shaft 152 configured to be rotatable in an airtight state, for example, by a magnetic fluid seal, is inserted through the center of the lid 151. A lower end of the rotary shaft 152 is connected to a rotary mechanism 154 of the lifting mechanism 153, and an upper end thereof is fixed to a turntable 155. On the turntable 155, the substrate holder 150 configured to hold the substrate W is placed via the heat insulating cylinder 156. The substrate holder 150 is, for example, a wafer boat. The substrate holder 150 is made of a heat-resistant material such as SiC or quartz. The substrate holder 150 holds a plurality of (e.g., 50 to 150) substrates W horizontally at a predetermined interval in the vertical direction.

By raising and lowering the lid 151 by the lifting mechanism 153, the substrate holder 150 can be carried into or out of the processing container 110. When the substrate holder 150 is carried into the processing container 110, the lid 151 is brought into close contact with the manifold 113 such that a space therebetween is hermetically sealed.

The gas supplier 120 includes a film forming gas supplier 121, a cleaning gas supplier 122, and a purge gas supplier 123.

The film forming gas supplier 121 introduces a film forming gas into the processing container 110. The film forming gas supplier 121 includes a gas source 121a, a gas supply pipe 121b, a gas nozzle 121c, an opening/closing valve 121d, and a flow rate controller 121e. The gas source 121a is a source of the film forming gas. The gas supply pipe 121b guides the film forming gas from the gas source 121a to the gas nozzle 121c. The gas nozzle 121c is provided to penetrate the lower portion of the sidewall of the manifold 113, and is bent in the inner tube 112 in, for example, an L shape, so that a tip end of the gas nozzle 121c is directed upward. The gas nozzle 121c introduces the film forming gas into the inner tube 112 from a tip end thereof. The gas nozzle 121c is made of, for example, quartz. The opening/closing valve 121d is provided in the gas supply pipe 121b to open and close a flow path inside the gas supply pipe 121b. The flow rate controller 121e is provided in the gas supply pipe 121b to control a flow rate of the film forming gas flowing through the flow path inside the gas supply pipe 121b. The flow rate controller 121e is, for example, a mass flow controller.

The film forming gas supplier 121 may supply the film forming gas into the inner tube 112 while controlling the flow rate of the film forming gas.

The film forming gas is selected depending on the type of a film to be formed. The film to be formed is, for example, a silicon (Si) film, a germanium (Ge) film, or a silicon germanium (SiGe) film. When forming the Si film, a silane-based gas, such as a monosilane ($SiH_4$) gas or a disilane ($Si_2H_6$) gas, may be used as the film forming gas. When forming the Ge film, a germanium-based gas such as a monogermanium ($GeH_4$) gas and a digermanium ($Ge_2H_6$) gas may be used as the film forming gas. When forming the SiGe film, for example, a mixed gas of the silane-based gas and the germanium-based gas may be used as the film forming gas.

The cleaning gas supplier 122 introduces a cleaning gas into the processing container 110. The cleaning gas supplier 122 includes a gas source 122a, a gas supply pipe 122b, a gas nozzle 122c, an opening/closing valve 122d, and a flow rate controller 122e. The gas source 122a is a source of the cleaning gas. The gas supply pipe 122b guides the cleaning gas from the gas source 122a to the gas nozzle 122c. The gas nozzle 122c is provided to penetrate the lower portion of the sidewall of the manifold 113, and is bent in the inner tube 112 in, for example, an L shape, so that a tip end of the gas nozzle 122c is directed upward. The gas nozzle 122c introduces the cleaning gas into the inner tube 112 from the tip end thereof. The gas nozzle 122c is made of, for example, quartz. The opening/closing valve 122d is provided in the gas supply pipe 122b to open and close a flow path inside the gas supply pipe 122b. The flow rate controller 122e is provided in the gas supply pipe 122b to control a flow rate of the cleaning gas flowing through the flow path in the gas supply pipe 122b. The flow rate controller 122e is, for example, a mass flow controller.

The cleaning gas supplier 122 may supply the cleaning gas into the inner tube 112 while controlling the flow rate of the cleaning gas.

The cleaning gas is, for example, a halogen-containing gas such as a fluorine-containing gas, a chlorine-containing gas, a bromine-containing gas, or an iodine-containing gas. The fluorine-containing gas is, for example, a fluorine ($F_2$) gas, a chlorine trifluoride ($ClF_3$) gas, and a nitrogen trifluoride ($NF_3$) gas. The chlorine-containing gas is, for example, a chlorine ($Cl_2$) gas or a hydrogen chloride (HCl) gas. The bromine-containing gas is, for example, a bromine ($Br_2$) gas or a hydrogen bromide (HBr) gas. The iodine-containing gas is, for example, an iodine ($I_2$) gas or a hydrogen iodide (HI) gas.

The purge gas supplier 123 introduces a purge gas into the processing container 110. The purge gas supplier 123 includes a gas source 123a, a gas supply pipe 123b, a gas nozzle 123c, an opening/closing valve 123d, and a flow rate controller 123e. The gas source 123a is a source of the purge gas. The gas supply pipe 123b guides the purge gas from the gas source 123a to the gas nozzle 123c. The gas nozzle 123c is provided to penetrate the lower portion of the sidewall of the manifold 113 and introduces the purge gas into the inner tube 112. The gas nozzle 123c is made of, for example, quartz. The opening/closing valve 123d is provided in the gas supply pipe 123b to open and close a flow path inside the gas supply pipe 123b. The flow rate controller 123e is provided in the gas supply pipe 123b to control a flow rate of the purge gas flowing through the flow path in the gas supply pipe 123b. The flow rate controller 123e is, for example, a mass flow controller.

The purge gas supplier 123 may supply the purge gas into the inner tube 112 while controlling the flow rate of the purge gas.

The purge gas is, for example, a noble gas, such as an Ar gas, or an inert gas such as, a $N_2$ gas.

The exhauster 130 is configured to be able to exhaust the interior of the processing container 110. The exhauster 130 includes an exhaust pipe 131, an exhaust device 132, and a pressure adjusting mechanism 133.

The exhaust pipe 131 is provided above the sidewall of the manifold 113, and discharges gas such as the film forming gas, the cleaning gas, the purge gas, or the like from the gap between the outer tube 111 and the inner tube 112.

The exhaust device 132 is connected to the exhaust pipe 131 and exhausts the interior of the processing container 110. The exhaust device 132 is, for example, a vacuum pump.

The pressure adjusting mechanism 133 is provided in the exhaust pipe 131. The pressure adjusting mechanism 133 is, for example, an automatic pressure control (APC) valve.

The heater 140 includes a heat insulating body 141 and a heater 142. The heat insulating body 141 is provided around the processing container 110, and is installed on a base plate 160. The heat insulating body 141 has a cylindrical shape with a ceiling. The heater 142 is provided on an inner peripheral surface of the heat insulating body 141. The heater 142 is connected to a power supply (not illustrated) and generates heat when electric power is supplied from the power supply.

In the above heat treatment part 100, the case in which the gas supplier 120 includes the film forming gas supplier 121, the cleaning gas supplier 122, and the purge gas supplier 123 one by one has been described, but the present disclosure is not limited thereto. For example, the number of the film-forming gas supplier 121, the cleaning gas supplier 122, and the purge gas supplier 123 may be determined depending on the types of gases to be used, and a plurality of film-forming gas suppliers 121, a plurality of cleaning gas suppliers 122, and a plurality of purge gas suppliers 123 may be provided.

[Operation of Substrate Processing Apparatus]

FIG. 4 is a flowchart illustrating the operation of the substrate processing apparatus 1 of an embodiment. FIG. 4 also illustrates a film forming process performed on the substrate W, which is performed prior to a cleaning process of the substrate processing apparatus 1. In the cleaning process, a first cleaning step S4, a second cleaning step S5, and a third cleaning step S6 are performed in this order. In the film forming process, a carry-in step S1, a film forming step S2, and a carry-out step S3 are performed in this order.

The operation of the substrate processing apparatus 1 illustrated in FIG. 4 is repeatedly carried out under the control of the controller 90 by changing the substrate W. FIG. 4 illustrates a case in which the cleaning process is performed once for each film formation process, but the technique of the present disclosure is not limited thereto. For example, the cleaning process may be performed after the film forming process is performed multiple times. Each step will be described below.

The carry-in step S1 is a step of carrying substrates W into the processing container 110. In the carry-in step S1, first, the controller 90 controls the wafer transfer mechanism 27 to place the plurality of substrates W on the substrate holder 150 outside the processing container 110. The substrate holder 150 holds the plurality of substrates W horizontally at intervals in the vertical direction. Next, the controller 90 controls the lifting mechanism 153 to raise the lid 151 and the substrate holder 150. As a result, the substrates W are carried into the processing container 110 together with the substrate holder 150, and the opening at the lower end of the processing container 110 is hermetically closed by the lid 151.

The film forming step S2 is a step of forming a film on the substrates W. In the film forming step S2, the controller 90 controls each part of the heat treatment part 100 to adjust a temperature of the substrates W and an internal pressure of the processing container 110, to rotate the substrate holder 150, and to supply the film forming gas into the processing container 110 such that the film is formed on the substrates W. The film to be formed is, for example, a Si film, a Ge film, or a SiGe film. The Si film, the Ge film, and the SiGe film may be non-doped films, or may be films doped with carbon, phosphorus, boron, or the like. After forming a desired film on the substrates W, the controller 90 controls each part of the heat treatment part 100 to supply the purge gas into the processing container 110 instead of the film forming gas to purge the interior of the processing container 110. Subsequently, the controller 90 controls each part of the heat treatment part 100 to stop the exhaust of the interior of the processing container 110 and to return the internal pressure of the processing container 110 to an atmospheric pressure.

The carry-out step S3 is a step of carrying out the substrate W to the outside of the processing container 110. In the carry-out step S3, the controller 90 controls the lifting mechanism 153 to lower the lid 151 and the substrate holder 150. As a result, the lid 151 opens the opening at the lower end of the processing container 110, and the substrates W are carried out of the processing container 110 together with the substrate holder 150. Thereafter, the controller 90 controls the wafer transfer mechanism 27 to take out the substrates W from the substrate holder 150.

The first cleaning step S4 is a step of removing deposits accumulated inside the processing container 110 by supplying the fluorine-containing gas into the processing container 110 in a state in which the substrate holder 150 is not present inside the processing container 110. The deposits are, for example, a Si film, a Ge film, or a SiGe film deposited in the film forming step S2.

In the first cleaning step S4, the controller 90 moves the shutter 30 from an open position to a closed position to seal the opening at the lower end of the processing container 110. Subsequently, the controller 90 controls each part of the heat treatment part 100 to adjust the temperature and the internal pressure of the processing container 110 and to supply the fluorine-containing gas into the processing container 110, thereby removing the deposits deposited on the interior of the processing container 110. The fluorine-containing gas is, for example, a $F_2$ gas, a $ClF_3$ gas, and a $NF_3$ gas. Since the etching reaction for Si, Ge, and SiGe of the fluorine-containing gas proceeds even at a low temperature, it is possible to remove the deposits deposited on the interior of the exhaust pipe 131 that has a lower temperature than the interior of the processing container 110, in addition to the deposits deposited on the interior of the processing container 110. The temperature inside the processing container 110 in the first cleaning step S4 is preferably 300 degrees C. to 400 degrees C. from the viewpoint that the deposits deposited on the interior the processing container 110 and the interior of the exhaust pipe 131 can be removed in a short period of time.

The second cleaning step S5 is a step of removing deposits deposited on at least the substrate holder 150 by supplying a fluorine-free halogen-containing gas to the interior of the processing container 110 in a state in which the substrate holder 150 is present inside the processing container 110. The deposits are, for example, a Si film, a Ge film, or a SiGe film deposited in the film forming step S2.

In the second cleaning step S5, the controller 90 moves the shutter 30 from the closed position to the open position to open the opening at the lower end of the processing container 110 and controls the lifting mechanism 153 to raise the lid 151 and the substrate holder 150. As a result, the substrate holder 150 is carried into the processing container 110, and the opening at the lower end of the processing container 110 is hermetically closed by the lid 151. The substrate holder 150 is a substrate holder after the substrates W were carried out in the carry-out step S3, and is, for example, an empty substrate holder or a substrate holder on which only a dummy substrate is mounted. The dummy substrate is, for example, a SiC dummy or a quartz dummy.

Subsequently, the controller 90 adjusts the temperature and the internal pressure of the processing container 110 and supplies a fluorine-free halogen-containing gas to the interior of the processing container 110. The fluorine-free halogen-containing gas is, for example, a chlorine-containing gas, such as a $Cl_2$ gas or a HCl gas, a bromine-containing gas, such as a $Br_2$ gas or a HBr gas, or an iodine-containing gas, such as an $I_2$ gas or a HI gas. The fluorine-free halogen-containing gas is less likely to etch SiC than the fluorine-containing gas. Therefore, when the substrate holder 150 or the dummy substrate is formed of a SiC member, damage to the substrate holder 150 or the dummy substrate can be suppressed, and the Si film, the Ge film, and the SiGe film which are deposits can be removed. However, since the etching reaction for Si, Ge, and SiGe is unlikely to proceed at a low temperature with the fluorine-free halogen-containing gas, deposits deposited on the interior of the exhaust pipe 131 that is colder than the interior of the processing container 110 may remain without being removed. In addition, the fluorine-free halogen-containing gas is likely to react with Si, Ge, SiGe to generate a product containing Si, Ge, SiGe, and halogen. Therefore, the product may adhere to a relatively low temperature portion such as the interior of the exhaust pipe 131 or the interiors of the gas nozzles 121c, 122c, 123c. When the interior of the processing container 110 is exposed to the air in the state in which the product adheres thereto, the product may cause corrosion. The temperature inside the processing container 110 in the second cleaning step S5 is, for example, 500 degrees C. to 650 degrees C.

The third cleaning step S6 is a step of removing at least the deposits deposited on the interior of the exhaust pipe 131 by supplying the fluorine-containing gas to at least one of the interior of the processing container 110 and the interior of the exhaust pipe 131. The deposits are residual films that could not be completely removed in the first cleaning step S4 and the second cleaning step S5 among, for example, a product containing Si, Ge, SiGe, and halogen generated in the second cleaning step S5, and the Si film, the Ge film, and the SiGe film deposited in the film forming step S2.

The third cleaning step S6 is performed, for example, in a state in which the substrate holder 150 is present inside the processing container 110. In this case, in the state in which the substrate holder 150 is present inside the processing container 110, the controller 90 controls each part of the heat treatment part 100 to adjust the temperature and the internal pressure of the processing container 110 and to supply the fluorine-containing gas into the processing container 110. The fluorine-containing gas is, for example, a $F_2$ gas, a $ClF_3$ gas, or a $NF_3$ gas. When the substrate holder 150 or the dummy substrate is formed of a SiC member, damage to the substrate holder 150 or the dummy substrate can be suppressed for the following reasons. In the third cleaning step S6, since the amount of deposits to be removed is small, the fluorine-containing gas may be supplied in a short period of time. In addition, since the Si film, the Ge film, and the SiGe film, which are deposits on the SiC member, are removed in the second cleaning step S5, the heat of reaction between the deposit films and the fluorine-containing gas is unlikely to occur on the SiC member, and thus an etching reaction to SiC is unlikely to occur. The internal temperature of the processing container 110 in the third cleaning step S6 performed in the state in which the substrate holder 150 is present inside the processing container 110 is, for example, 100 degrees C. to 300 degrees C. This is to further suppress damage to the SiC member because the amount of deposits to be removed is small and the etching reaction of the fluorine-containing gas proceeds even at a low temperature.

In addition, the third cleaning step S6 may be performed, for example, in the state in which the substrate holder 150 is not present inside the processing container 110. In this case, the controller 90 controls the lifting mechanism 153 to lower the lid 151 and the substrate holder 150. As a result, the lid 151 opens the opening at the lower end of the processing container 110, and the substrate holder 150 is carried out of the processing container 110. Thereafter, the controller 90 moves the shutter 30 from the open position to the closed position to close the opening at the lower end of the processing container 110. Subsequently, the controller 90 adjusts the temperature and the internal pressure of the processing container 110 and supplies the fluorine-containing gas to the interior of the processing container 110. The internal temperature of the processing container 110 in the third cleaning step S6 performed in the state in which the substrate holder 150 is not present inside the processing container 110 is, for example, 100 degrees C. to 400 degrees C. Preferably, the temperature is 300 degrees C. to 400 degrees C.

Furthermore, in the third cleaning step S6, in addition to or instead of supplying the fluorine-containing gas to the interior of the processing container 110, the fluorine-containing gas may be directly supplied to the interior of the exhaust pipe 131 from the gas supplier (not illustrated) connected to the exhaust pipe 131. By supplying the fluorine-containing gas to the interior of the exhaust pipe 131, the deposits deposited on the interior of the exhaust pipe 131 can be efficiently removed with a smaller flow rate than that in the case in which the fluorine-containing gas is supplied to the interior of the processing container 110.

In FIG. 4, the cleaning process includes the first cleaning step S4, the second cleaning step S5, and the third cleaning step S6, but the technique of the present disclosure is not limited thereto. For example, the first cleaning step S4 may be omitted.

Hereinafter, an example of the cleaning process will be described by taking, as an example, a case in which Si films, which are deposits deposited on the interior of the processing container 110, the interior of the exhaust pipe 131, the heat insulating cylinder 156, and the substrate holder 150 formed of a SiC member, are removed.

Figure 5A:
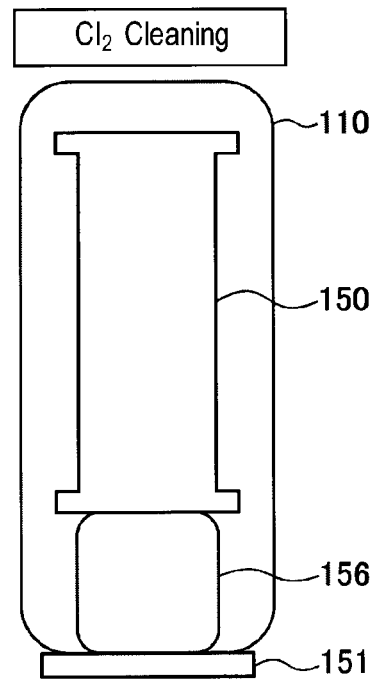
FIG. 5A is a view illustrating a first example of a cleaning process.
Figure 5B:
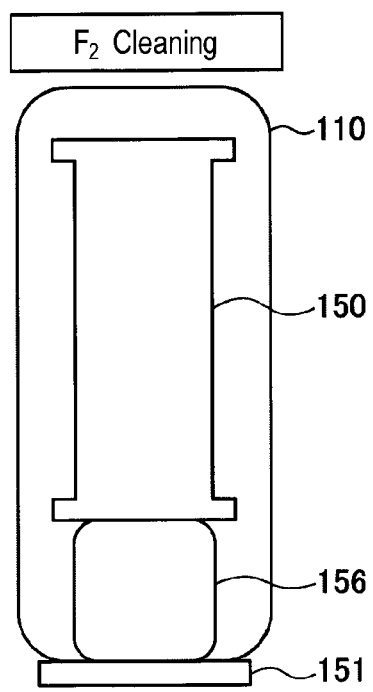
FIG. 5B is a view illustrating the first example of the cleaning process.

FIGS. 5A and 5B are views illustrating a first example of the cleaning process. The cleaning process of the first example does not include a step corresponding to the first cleaning step S4, but includes a second cleaning step S15 illustrated in FIG. 5A and a third cleaning step S16 illustrated in FIG. 5B.

The second cleaning step S15 corresponds to the above-described second cleaning step S5. The second cleaning step S15 is a step of heating the interior of the processing container 110 to 500 degrees C. to 650 degrees C. in the state in which the heat insulating cylinder 156 and the substrate holder 150 are present inside the processing container 110 and supplying a $Cl_2$ gas to the interior of the processing container 110. In the second cleaning step S15, the Si films deposited on the interior of the processing container 110, the interior of the exhaust pipe 131, the heat insulating cylinder 156, and the substrate holder 150 are removed. At this time, the $Cl_2$ gas reacts with the Si films to generate products containing Cl and Si, such as silicon tetrachloride ($SiCl_4$), and the products containing Cl and Si adheres to the interior of the exhaust pipe 131, the interior of the gas supply pipe, and the like.

The third cleaning step S16 corresponds to the above-described third cleaning step S6. The third cleaning step S16 is a step of supplying a $F_2$ gas to at least one of the interior of the processing container 110 and the interior of the exhaust pipe 131 in the state in which the heat insulating cylinder 156 and the substrate holder 150 are present inside the processing container 110. In the third cleaning step S16, the interior of the processing container 110 is heated to, for example, 100 degrees C. to 300 degrees C. In the third cleaning step S16, the $F_2$ gas reacts with products containing Cl and Si generated in the second cleaning step S15 to form silicon tetrafluoride ($SiF_4$) having a high vapor pressure and to be exhausted. Therefore, the products containing Cl and Si and adhering to the interior of the exhaust pipe 131, the interior of the gas supply pipe, and the like can be removed.

The case in which the second cleaning step S15 is not performed is considered. In this case, the $F_2$ gas is supplied to the interior of the processing container 110 in the state in which Si films are deposited on the interior of the processing container 110, the interior of the exhaust pipe 131, the heat insulating cylinder 156, the substrate holder 150, and the like. Since reaction heat is generated during etching, the surface temperatures of the interior of the processing container 110, the interior of the exhaust pipe 131, the heat insulating cylinder 156, the substrate holder 150, and the like rise more than the temperature heated by the heater 142. Therefore, when the substrate holder 150 is formed of a SiC member, there is a high possibility that the substrate holder 150 will be etched and damaged. It is conceivable to set the temperature at which a Si film is removed to an extremely low temperature in advance in order to suppress damage to the SiC member. However, in that case, it takes a long time to remove the Si film, which is not realistic.

In contrast, in the first example, first, in the second cleaning step S15, the Si films deposited on the interior of the processing container 110, the interior of the exhaust pipe 131, the heat insulating cylinder 156, and the substrate holder 150 are removed with a $Cl_2$ gas that is unlike to etch SiC. Next, in the third cleaning step S16, the products containing Cl and Si generated in the second cleaning step S15 are removed. As a result, even when the substrate holder 150 is formed of a SiC member, damage to the substrate holder 150 can be suppressed.

Figure 6A:
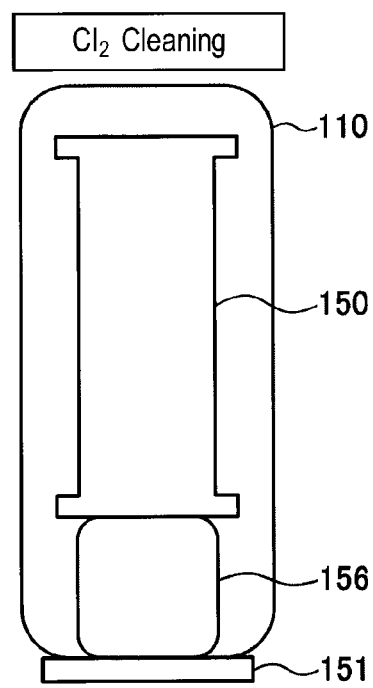
FIG. 6A is a view illustrating a second example of the cleaning process.
Figure 6B:
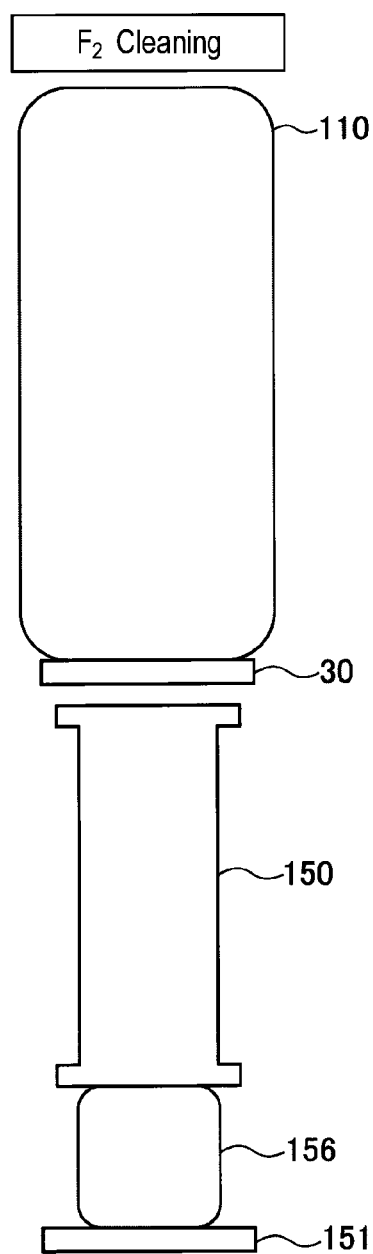
FIG. 6B is a view illustrating the second example of the cleaning process.

FIGS. 6A and 6B are diagrams showing a second example of the cleaning process. The cleaning process of the second example does not include a step corresponding to the first cleaning step S4, but includes a second cleaning step S25 illustrated in FIG. 6A and a third cleaning step S26 illustrated in FIG. 6B.

The second cleaning step S25 is the same as the second cleaning step S15 of the first example. That is, the second cleaning step S25 is a step of heating the interior of the processing container 110 to 500 degrees C. to 650 degrees C. and supplying a $Cl_2$ gas to the interior of the processing container 110 in the state in which the heat insulating cylinder 156 and the substrate holder 150 are present inside the processing container 110. In the second cleaning step S25, the Si films deposited on the interior of the processing container 110, the interior of the exhaust pipe 131, the heat insulating cylinder 156, and the substrate holder 150 are removed. At this time, the $Cl_2$ gas reacts with the Si films to generate products containing Cl and Si, such as silicon tetrachloride ($SiCl_4$), and the products containing Cl and Si adhere to the interior of the exhaust pipe 131, the interior of the gas supply pipe, and the like.

The third cleaning step S26 corresponds to the above-described third cleaning step S6. The third cleaning step S26 is a step of supplying a $F_2$ gas to at least one of the interior of the processing container 110 and the interior of the exhaust pipe 131 in the state in which the heat insulating cylinder 156 and the substrate holder 150 are not present inside the processing container 110. In the third cleaning step S26, the lid 151 and the substrate holder 150 are lowered by the lifting mechanism 153. The lid 151 opens the opening at the lower end of the processing container 110, and the substrate holder 150 is carried out of the processing container 110. Thereafter, the shutter 30 is moved from the open position to the closed position to close the opening at the lower end of the processing container 110, and a fluorine-containing gas is supplied to the interior of the processing container 110 while exhausting the interior of the processing container 110 such that the internal pressure of the processing container 110 becomes a set value. In addition, the interior of the processing container 110 is heated to, for example, 300 degrees C. to 400 degrees C. In the third cleaning step S26, the $F_2$ gas reacts with the products containing Cl and Si generated in the second cleaning step S25 to form $SiF_4$ having a high vapor pressure and to be exhausted. Therefore, the products containing Cl and Si and adhering to the interior of the gas supply pipe and the like can be removed.

In the second example, first, in the second cleaning step S25, the Si films deposited on the interior of the processing container 110, the interior of the exhaust pipe 131, the heat insulating cylinder 156, and the substrate holder 150 are removed with the $Cl_2$ gas that is unlike to etch SiC. Next, in the third cleaning step S26, the products containing Cl and Si generated in the second cleaning step S25 are removed. As a result, even when the substrate holder 150 is formed of a SiC member, damage to the substrate holder 150 can be suppressed.

In the second example, the third cleaning step S26 is performed in the state in which the substrate holder 150 is not present inside the processing container 110. As a result, the substrate holder 150 is not exposed to the $F_2$ gas, and thus it is possible to significantly suppress damage to the substrate holder 150.

Figure 7B:
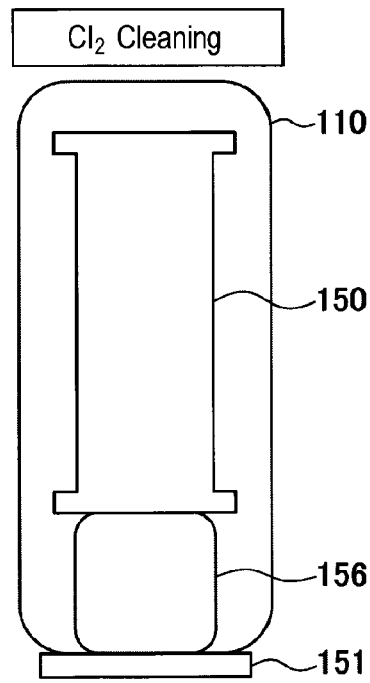
FIG. 7B is a view illustrating the third example of the cleaning process.
Figure 7C:
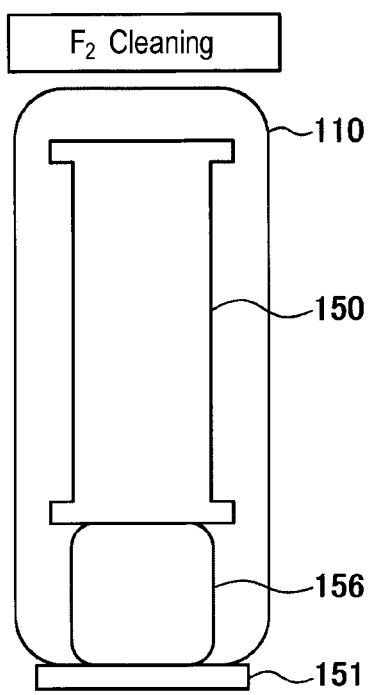
FIG. 7C is a view illustrating the third example of the cleaning process.

FIGS. 7A, 7B, and 7C are views illustrating a third example of the cleaning process. The cleaning process of the third example includes a first cleaning step S34 illustrated in FIG. 7A, a second cleaning step S35 illustrated in FIG. 7B, and a third cleaning step S36 illustrated in FIG. 7C.

The first cleaning step S34 corresponds to the above-described first cleaning step S4. The first cleaning step S34 is a step of heating the interior of the processing container 110 to 300 degrees C. to 400 degrees C. in the state in which the heat insulating cylinder 156 is present and the substrate holder 150 is not present inside the processing container 110 and supplying a $F_2$ gas to the interior of the processing container 110. In the first cleaning step S34, the substrate holder 150 on the heat insulating cylinder 156 is transferred onto the boat holder 29 by a transfer device, and the lid 151 and the heat insulating cylinder 156 are raised. As a result, the heat insulating cylinder 156 is carried into the processing container 110, and the opening at the lower end of the processing container 110 is hermetically closed by the lid 151. In the first cleaning step S34, the Si films deposited on the interior of the processing container 110, the interior of the exhaust pipe 131, and the heat insulating cylinder 156 are removed.

The second cleaning step S35 corresponds to the above-described second cleaning step S5. The second cleaning step S35 is a step of heating the interior of the processing container 110 to 500 degrees C. to 650 degrees C. in the state in which the heat insulating cylinder 156 and the substrate holder 150 are present inside the processing container 110 and supplying a $Cl_2$ gas to the interior of the processing container 110. In the second cleaning step S35, the lid 151 and the heat insulating cylinder 156 are lowered by the lifting mechanism 153. The lid 151 opens the opening at the lower end of the processing container 110, and the heat insulating cylinder 156 is carried out of the processing container 110. Next, the substrate holder 150 placed on the boat holder 29 is transferred onto the heat insulating cylinder 156 by the transfer device, and the lid 151, the heat insulating cylinder 156, and the substrate holder 150 are raised. As a result, the heat insulating cylinder 156 and the substrate holder 150 are carried into the processing container 110, and the opening in the lower end of the processing container 110 is hermetically closed by the lid 151. In the second cleaning step S35, the Si film, which has been deposited on the substrate holder 150 but has not been removed in the first cleaning step S34, is removed. In the second cleaning step S35, since the amount of the Si film to be removed is small, the amount of $SiCl_4$ and the like generated by the reaction between the $Cl_2$ gas and the Si film is small.

The third cleaning step S36 corresponds to the above-mentioned third cleaning step S6. The third cleaning step S36 is a step of supplying a $F_2$ gas to at least one of the interior of the processing container 110 and the interior of the exhaust pipe 131 in the state in which the heat insulating cylinder 156 and the substrate holder 150 are present inside the processing container 110. In the third cleaning step S36, the interior of the processing container 110 is heated to, for example, 100 degrees C. to 300 degrees C. In the third cleaning step S36, the $F_2$ gas reacts with the products containing Cl and Si generated in the second cleaning step S35 to form $SiF_4$ having a high vapor pressure and to be exhausted. Therefore, the products containing Cl and Si and adhering to the interior of the exhaust pipe 131, the interior of the gas supply pipe, and the like can be removed. At this time, since the amount of $SiC_4$ and the like generated in the second cleaning step S35 is small, the processing time in the third cleaning step S36 can be shortened, and damage to the substrate holder 150 formed of a SiC member can be further reduced.

In the third example, first, in the first cleaning step S34, the Si films deposited on the interior of the processing container 110, the interior of the exhaust pipe 131, and the heat insulating cylinder 156 are removed. Next, in the second cleaning step S35, the Si film deposited on the substrate holder 150 is removed. Next, in the third cleaning step S36, the products containing Cl and Si generated in the second cleaning step S35 are removed. As a result, even when the substrate holder 150 is formed of a SiC member, damage to the substrate holder 150 can be suppressed.

In addition, in the third example, since the amount of the Si films removed by using the $Cl_2$ gas is small, the amount of $SiC_4$ and the like generated in the second cleaning step S35 is also small. Therefore, the processing time of the third cleaning step S36 can be shortened, and the time for which the substrate holder 150 is exposed to the $F_2$ gas is shortened. Therefore, damage to the substrate holder 150 formed of the SiC member can be further reduced.

In the third example, the first cleaning step S34 can be performed while the substrates W placed on the substrate holder 150 are being cooled or while the wafer transfer mechanism 27 is taking out the substrates W from the substrate holder 150. Therefore, the period of time required for the cleaning process is shortened and the productivity is improved.

Figure 8B:
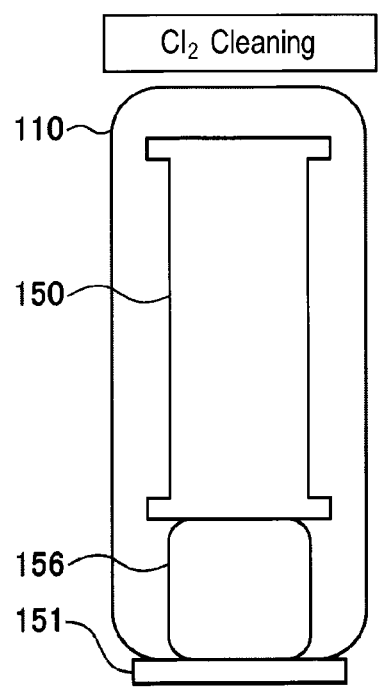
FIG. 8B is a view illustrating the fourth example of the cleaning process.

FIGS. 8A, 8B, and 8C are views illustrating a fourth example of the cleaning process. The cleaning process of the fourth example includes a first cleaning step S44 illustrated in FIG. 8A, a second cleaning step S45 illustrated in FIG. 8B, and a third cleaning step S46 illustrated in FIG. 8C.

The first cleaning step S44 and the second cleaning step S45 are the same as the first cleaning step S34 and the second cleaning step S35 of the third example, respectively.

The third cleaning step S46 corresponds to the above-mentioned third cleaning step S6. The third cleaning step S46 is a step of supplying a $F_2$ gas to the interior of the processing container 110 in the state in which the substrate holder 150 is not present inside the processing container 110. In the third cleaning step S46, the lid 151 and the substrate holder 150 are lowered by the lifting mechanism 153. The lid 151 opens the opening at the lower end of the processing container 110, and the substrate holder 150 is carried out of the processing container 110. Thereafter, the substrate holder 150 on the heat insulating cylinder 156 is transferred onto the boat holder 29 by a transfer device, and the lid 151 and the heat insulating cylinder 156 are raised. As a result, the heat insulating cylinder 156 is carried into the processing container 110, and the opening at the lower end of the processing container 110 is hermetically closed by the lid 151. In addition, the interior of the processing container 110 is heated to, for example, 300 degrees C. to 400 degrees C. In the third cleaning step S46, the $F_2$ gas reacts with the products containing Cl and Si generated in the second cleaning step S45 to form $SiF_4$ having a high vapor pressure and to be exhausted. Therefore, the products containing Cl and Si and adhering to the interior of the exhaust pipe 131, the interior of the gas supply pipe, and the like can be removed. At this time, since the amount of $SiC_4$ and the like generated in the second cleaning step S45 is small, the processing time in the third cleaning step S46 can be shortened. In addition, since the substrate holder 150 is not present inside the processing container 110, damage to the substrate holder 150 formed of a SiC member can be further reduced.

In the fourth example, first, in the first cleaning step S44, the Si films deposited on the interior of the processing container 110, the interior of the exhaust pipe 131, and the heat insulating cylinder 156 are removed. Next, in the second cleaning step S45, the Si film deposited on the substrate holder 150 is removed. Next, in the third cleaning step S46, the products containing Cl and Si generated in the second cleaning step S45 are removed. As a result, even when the substrate holder 150 is formed of a SiC member, damage to the substrate holder 150 can be suppressed.

In the fourth example, the third cleaning step S46 is performed in the state in which the substrate holder 150 is not present inside the processing container 110. As a result, the substrate holder 150 is not exposed to the $F_2$ gas, and thus it is possible to significantly suppress damage to the substrate holder 150.

In addition, in the fourth example, since the amount of the Si films removed by using the $Cl_2$ gas is small, the amount of $SiC_4$ and the like generated in the second cleaning step S45 is also small. Therefore, the processing time in the third cleaning step S46 can be shortened.

In the fourth example, the first cleaning step S44 can be performed while the substrates W placed on the substrate holder 150 are being cooled or while the wafer transfer mechanism 27 is taking out the substrates W from the substrate holder 150. Therefore, the period of time required for the cleaning process is shortened and the productivity is improved.

Figure 9B:
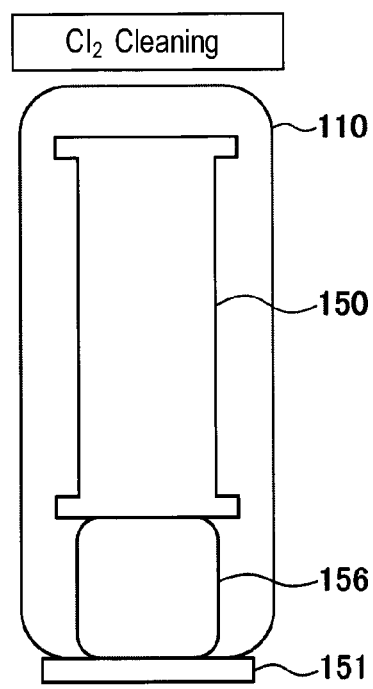
FIG. 9B is a view illustrating the fifth example of the cleaning process.
Figure 9C:
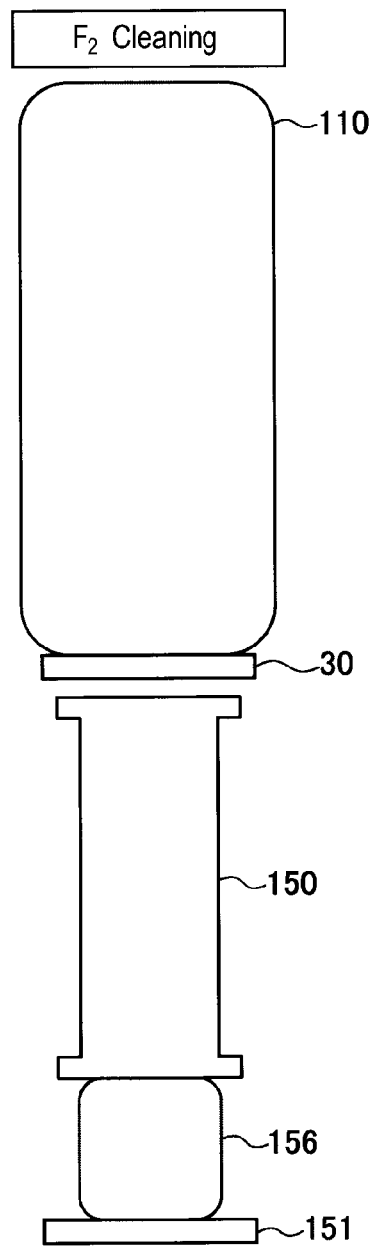
FIG. 9C is a view illustrating the fifth example of the cleaning process.

FIGS. 9A, 9B, and 9C are views illustrating a fifth example of the cleaning process. The cleaning process of the fifth example includes a first cleaning step S54 illustrated in FIG. 9A, a second cleaning step S55 illustrated in FIG. 9B, and a third cleaning step S56 illustrated in FIG. 9C.

The first cleaning step S54 and the second cleaning step S55 are the same as the first cleaning step S34 and the second cleaning step S35 of the third example, respectively.

The third cleaning step S56 is the same as the third cleaning step S26 of the second example.

In the fifth example, first, in the first cleaning step S54, the Si films deposited on the interior of the processing container 110, the interior of the exhaust pipe 131, and the heat insulating cylinder 156 are removed. Next, in the second cleaning step S55, the Si film deposited on the substrate holder 150 is removed. Next, in the third cleaning step S56, the products containing Cl and Si generated in the second cleaning step S55 are removed. As a result, even when the substrate holder 150 is formed of a SiC member, damage to the substrate holder 150 can be suppressed.

In the fifth example, the third cleaning step S56 is performed in the state in which the substrate holder 150 is not present inside the processing container 110. As a result, the substrate holder 150 is not exposed to the $F_2$ gas, and thus it is possible to significantly suppress damage to the substrate holder 150.

In addition, in the fifth example, since the amount of the Si films removed by using the $Cl_2$ gas is small, the amount of $SiC_4$ and the like generated in the second cleaning step S55 is also small. Therefore, the processing time in the third cleaning step S56 can be shortened.

In the fifth example, the first cleaning step S54 can be performed while the substrates W placed on the substrate holder 150 are being cooled or while the wafer transfer mechanism 27 is taking out the substrates W from the substrate holder 150. Therefore, the period of time required for the cleaning process is shortened and the productivity is improved.

Figure 10A:
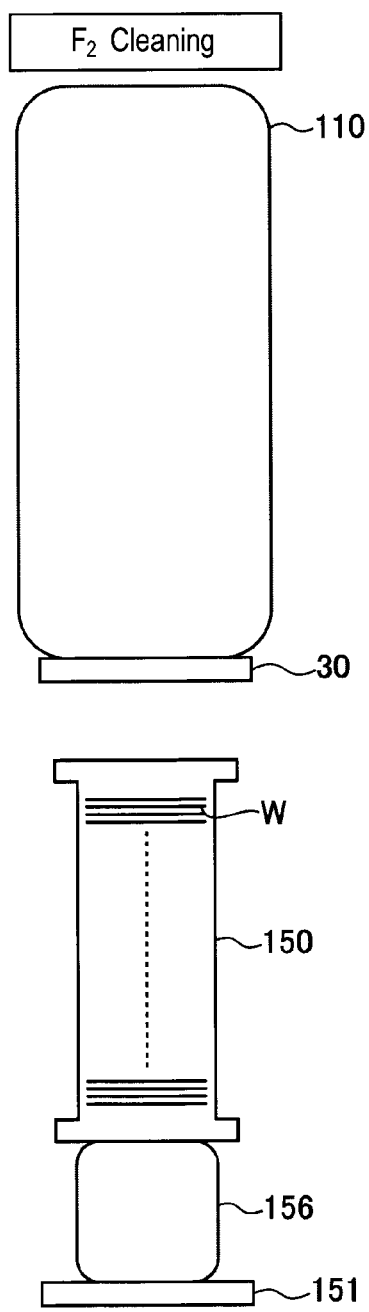
FIG. 10A is a view illustrating a sixth example of the cleaning process.
Figure 10B:
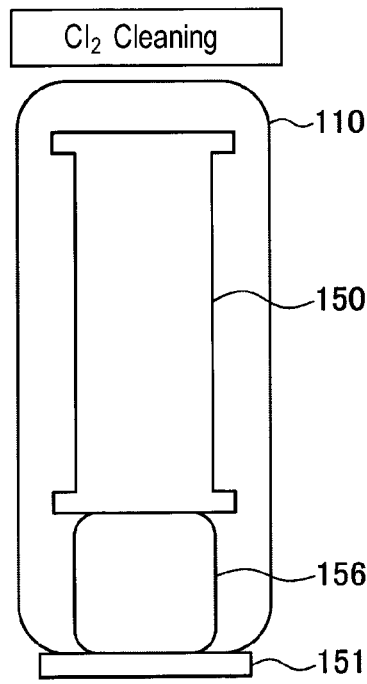
FIG. 10B is a view illustrating the sixth example of the cleaning process.
Figure 10C:
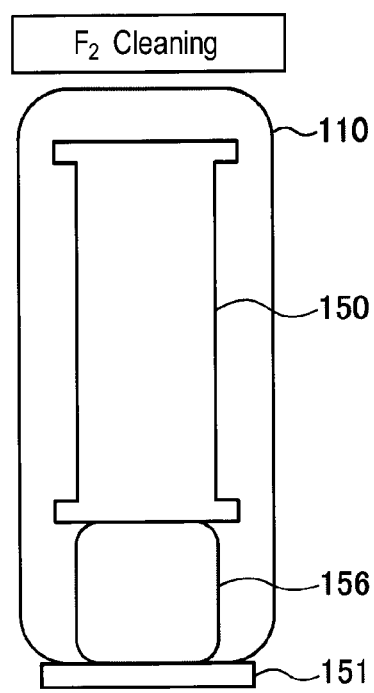
FIG. 10C is a view illustrating the sixth example of the cleaning process.

FIGS. 10A, 10B, and 10C are views illustrating a sixth example of the cleaning process. The cleaning process of the sixth example includes a first cleaning step S64 illustrated in FIG. 10A, a second cleaning step S65 illustrated in FIG. 10B, and a third cleaning step S66 illustrated in FIG. 10C.

The first cleaning step S64 corresponds to the above-described first cleaning step S4. The first cleaning step S64 is a step of heating the interior of the processing container 110 to 300 degrees C. to 400 degrees C. in the state in which the heat insulating cylinder 156 and the substrate holder 150 are not present inside the processing container 110 and supplying a $F_2$ gas to the interior of the processing container 110. In the first cleaning step S64, after the substrates W are carried out of the processing container 110 together with the substrate holder 150 in the carrying-out step S3, the shutter 30 is moved from the open position to the closed position to hermetically close the opening at the lower end of the processing container 110. Next, a fluorine-containing gas is supplied to the interior of the processing container 110 while exhausting the interior of the processing container 110 such that the internal pressure of the processing container 110 becomes a set value. In the first cleaning step S64, the Si films deposited on the interior of the processing container 110 and the interior of the exhaust pipe 131 are removed. The first cleaning step S64 can be performed while the substrates W placed on the substrate holder 150 are being cooled or while the wafer transfer mechanism 27 is taking out the substrates W from the substrate holder 150.

The second cleaning step S65 and the third cleaning step S66 are the same as the second cleaning step S15 (but different in the range of the target to be cleaned) and the third cleaning step S16 of the first example, respectively.

In the sixth example, first, in the first cleaning step S64, the Si films deposited on the interior of the processing container 110 and the interior of the exhaust pipe 131 are removed. Next, in the second cleaning step S65, the Si films deposited on the heat insulating cylinder 156 and the substrate holder 150 are removed. Next, in the third cleaning step S66, the products containing Cl and Si generated in the second cleaning step S65 are removed. As a result, even when the substrate holder 150 is formed of a SiC member, damage to the substrate holder 150 can be suppressed.

In addition, in the sixth example, since the amount of the Si films removed by using the $Cl_2$ gas is small, the amount of $SiC_4$ and the like generated in the second cleaning step S65 is also small. Therefore, the processing time of the third cleaning step S66 can be shortened, and the time for which the substrate holder 150 is exposed to the $F_2$ gas is shortened. Therefore, damage to the substrate holder 150 formed of the SiC member can be further reduced.

In the sixth example, the first cleaning step S64 can be performed while the substrates W placed on the substrate holder 150 are being cooled or while the wafer transfer mechanism 27 is taking out the substrates W from the substrate holder 150. Therefore, the period of time required for the cleaning process is shortened and the productivity is improved.

Figure 11A:
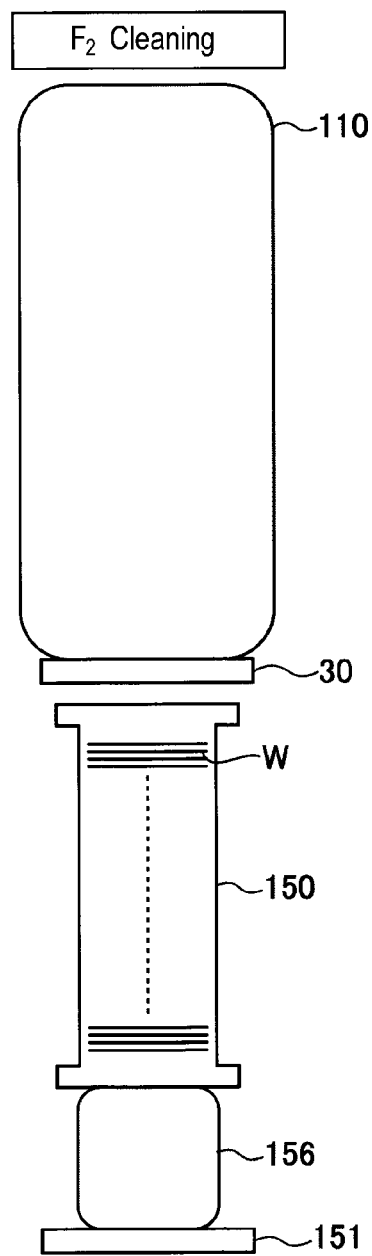
FIG. 11A is a view illustrating a seventh example of the cleaning process.
Figure 11B:
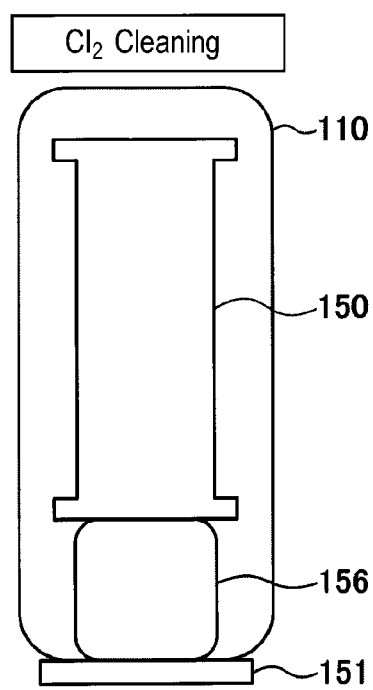
FIG. 11B is a view illustrating the seventh example of the cleaning process.
Figure 11C:
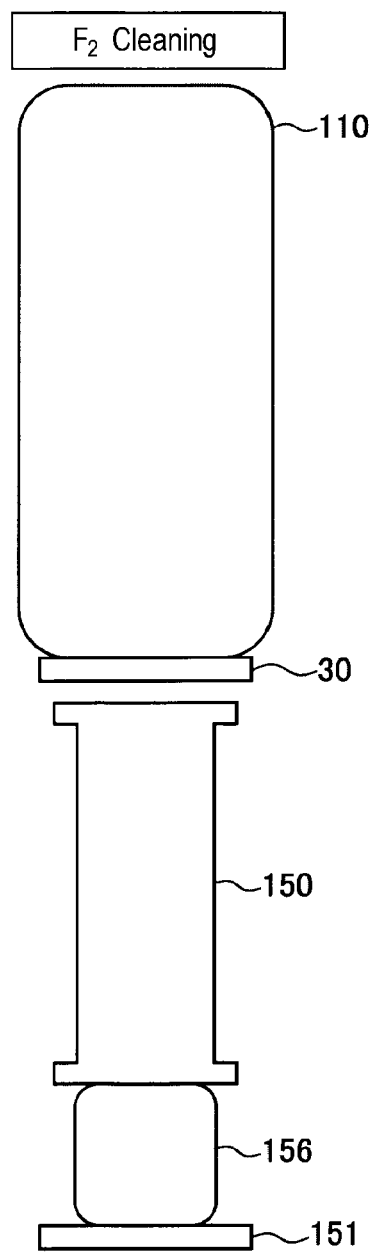
FIG. 11C is a view illustrating the seventh example of the cleaning process.

FIGS. 11A, 11B, and 11C are views illustrating a seventh example of the cleaning process. The cleaning process of the seventh example includes a first cleaning step S74 illustrated in FIG. 11A, a second cleaning step S75 illustrated in FIG. 11B, and a third cleaning step S76 illustrated in FIG. 11C.

The first cleaning step S74 and the second cleaning step S75 are the same as the first cleaning step S64 and the second cleaning step S65 of the sixth example, respectively.

The third cleaning step S76 is the same as the third cleaning step S26 of the second example.

In the seventh example, first, in the first cleaning step S74, the Si films deposited on the interior of the processing container 110 and the interior of the exhaust pipe 131 are removed. Next, in the second cleaning step S75, the Si films deposited on the heat insulating cylinder 156 and the substrate holder 150 are removed. Next, in the third cleaning step S76, the products containing Cl and Si generated in the second cleaning step S75 are removed. As a result, even when the substrate holder 150 is formed of a SiC member, damage to the substrate holder 150 can be suppressed.

In the seventh example, the third cleaning step S76 is performed in the state in which the substrate holder 150 is not present inside the processing container 110. As a result, the substrate holder 150 is not exposed to the $F_2$ gas, and thus it is possible to significantly suppress damage to the substrate holder 150.

In addition, in the seventh example, since the amount of the Si films removed by using the $Cl_2$ gas is small, the amount of $SiC_4$ and the like generated in the second cleaning step S75 is also small. Therefore, the processing time in the third cleaning step S76 can be shortened.

In the seventh example, the first cleaning step S74 can be performed while the substrates W placed on the substrate holder 150 are being cooled or while the wafer transfer mechanism 27 is taking out the substrates W from the substrate holder 150. Therefore, the period of time required for the cleaning process is shortened and the productivity is improved.

It should be understood that the embodiments disclosed herein are exemplary in all respects and are not restrictive. The above-described embodiments may be omitted, replaced, or modified in various forms without departing from the scope and spirit of the appended claims.

The present international application claims the priority from Japanese Patent Application No. 2019-150680 filed on Aug. 20, 2019, the disclosure of which is incorporated herein in its entirety by reference.

EXPLANATION OF REFERENCE NUMERALS

1: substrate processing apparatus, 90: controller, 100: heat treatment part, 110: processing container, 120: gas supplier, 122: cleaning gas supplier, 130: exhauster, 131: exhaust pipe, 150: substrate holder, 156: heat insulating cylinder, W: substrate

What is claimed is:

1. A cleaning method comprising:
supplying a halogen-containing gas that does not contain fluorine to an interior of a processing container that is configured to be exhausted via an exhaust pipe to perform a cleaning; and
after the supplying the halogen-containing gas to perform the cleaning, supplying a fluorine-containing gas to at least one of the interior of the processing container and an interior of the exhaust pipe to perform the cleaning.

2. The cleaning method of claim 1, wherein the supplying the halogen-containing gas to perform the cleaning is performed in a state in which a SiC member is present in the interior of the processing container.

3. The cleaning method of claim 2, wherein the supplying the fluorine-containing gas to perform the cleaning is performed in a state in which the SiC member is not present in the interior of the processing container.

4. The cleaning method of claim 2, wherein the supplying the fluorine-containing gas to perform the cleaning is performed in the state in which the SiC member is present in the interior of the processing container.

5. The cleaning method of claim 2, further comprising:
before the supplying the halogen-containing gas to perform the cleaning, performing a film formation by supplying a film forming gas to the interior of the processing container.

6. The cleaning method of claim 5, wherein the supplying the halogen-containing gas to perform the cleaning is implemented after the performing the film formation is performed multiple times.

7. The cleaning method of claim 5, further comprising:
after the performing the film formation and before the supplying the halogen-containing gas to perform the cleaning, supplying the fluorine-containing gas to the interior of the processing container to perform the cleaning in a state in which the SiC member is not present in the interior of the processing container.

8. The cleaning method of claim 7, wherein the supplying the halogen-containing gas to perform the cleaning is implemented after the performing the film formation and the supplying the fluorine-containing gas to the interior of the processing container in the state in which the SiC is not present in the interior of the processing container to perform the cleaning are implemented multiple times.

9. The cleaning method of claim 2, wherein the SiC member includes at least one of a substrate holder on which a substrate is placed, a dummy substrate placed on the substrate holder, and a heat insulating cylinder in which the substrate holder is placed.

10. The cleaning method of claim 1, wherein the halogen-containing gas is a chlorine-containing gas.

11. The cleaning method of claim 10, wherein the chlorine-containing gas is a $Cl_2$ gas or a HCl gas.

12. A substrate processing apparatus comprising:
a processing container;
a gas supplier configured to supply a cleaning gas to an interior of the processing container;
an exhauster including an exhaust pipe configured to exhaust the cleaning gas in the interior of the processing container; and
a controller,
wherein the controller is configured to control the gas supplier to implement sequentially supplying a halogen-containing gas that does not contain fluorine to the interior of the processing container, and supplying a fluorine-containing gas to at least one of the interior of the processing container and an interior of the exhaust pipe to perform a cleaning.

* * * * *